US010692687B2

(12) United States Patent
Li et al.

(10) Patent No.: US 10,692,687 B2
(45) Date of Patent: Jun. 23, 2020

(54) MEASUREMENT AND INSPECTION DEVICE

(71) Applicant: HITACHI HIGH-TECHNOLOGIES CORPORATION, Tokyo (JP)

(72) Inventors: Wen Li, Tokyo (JP); Shinichi Murakami, Tokyo (JP); Hiroyuki Takahashi, Tokyo (JP); Yuko Sasaki, Tokyo (JP); Minoru Yamazaki, Tokyo (JP); Hajime Kawano, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 16/251,563

(22) Filed: Jan. 18, 2019

(65) Prior Publication Data
US 2019/0318906 A1 Oct. 17, 2019

(30) Foreign Application Priority Data

Jan. 30, 2018 (JP) .................... 2018-013509

(51) Int. Cl.
*H01J 37/147* (2006.01)
*H01J 37/04* (2006.01)
*G01N 23/2251* (2018.01)
*H01L 21/66* (2006.01)

(52) U.S. Cl.
CPC ........ *H01J 37/147* (2013.01); *G01N 23/2251* (2013.01); *H01J 37/045* (2013.01); *H01L 22/34* (2013.01); *H01J 2237/31776* (2013.01)

(58) Field of Classification Search
CPC .............................. H01J 37/045; H01J 37/147
See application file for complete search history.

(56) References Cited

U.S. PATENT DOCUMENTS

| 2009/0206272 | A1* | 8/2009 | Parker | ................... | B82Y 10/00 |
| | | | | | 250/396 R |
| 2014/0008534 | A1* | 1/2014 | Li | ......................... | H01J 37/265 |
| | | | | | 250/307 |
| 2014/0197326 | A1 | 7/2014 | Ohnishi | | |
| 2017/0301506 | A1* | 10/2017 | Matsumoto | ........... | H01J 37/045 |

FOREIGN PATENT DOCUMENTS

JP        2014-138050 A       7/2014

* cited by examiner

*Primary Examiner* — Eliza W Osenbaugh-Stewart
(74) *Attorney, Agent, or Firm* — Volpe and Koenig, P.C.

(57) ABSTRACT

A low noise blanking unit corresponds to a wide range of acceleration voltages (from several times higher than related voltages to low acceleration voltages) of an electron beam. A blanking unit of the measurement and inspection device includes a blanking control circuit, in which (i) an upper and a lower blanking electrodes are arranged in the irradiation direction of an electron beam; electrodes on the reverse sides of two opposing electrodes in each of the blanking electrodes arranged in the same direction are connected with the ground, (ii) when blanking is ON, positive voltages are output to remaining electrodes of the upper blanking electrode and negative voltages are output to remaining electrodes of the lower blanking electrode, and (iii) when the blanking is OFF, the same ground reference signal is output to the remaining electrodes of the upper blanking electrode and to the remaining electrodes of the lower blanking electrode.

11 Claims, 10 Drawing Sheets

404: HORIZONTAL LINE (CONTINUOUS IRRADIATION REGION) → LARGELY CHARGED
405: VERTICAL LINE (DISCONTINUOUS IRRADIATION REGION) → LESS CHARGED

FIG. 7A
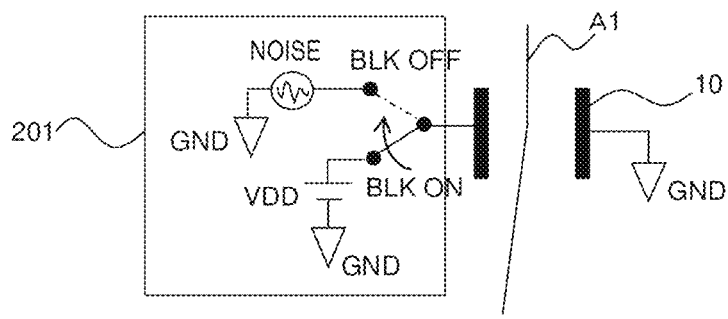
ONE-STAGE BLK
FIG. 7B
DEFLECTION OF TWO-STAGE BLK
IN SAME DIRECTION
FIG. 7C
DEFLECTION OF TWO-STAGE BLK
IN REVERSE DIRECTION
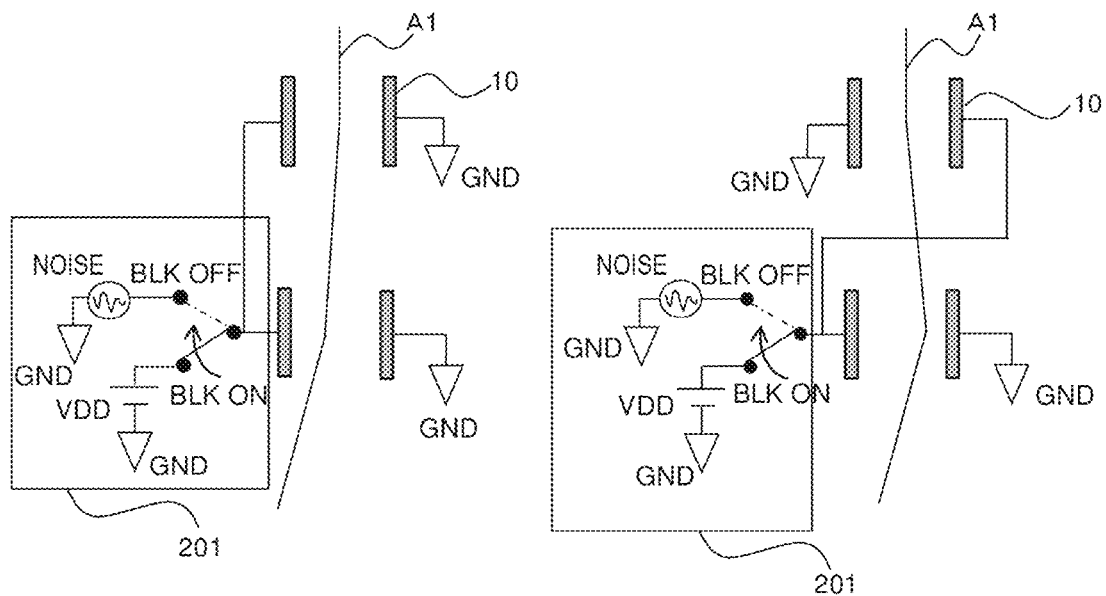

MEASUREMENT AND INSPECTION DEVICE

TECHNICAL FIELD

The present invention relates to a device for performing measurement or inspection (measurement and inspection device) on a sample (object) such as a semiconductor substrate (wafer), and a scanning electron beam type electron microscope device (SEM).

BACKGROUND ART

In a semiconductor manufacturing process, miniaturization of a circuit pattern formed on a semiconductor substrate (wafer) has been rapidly progressing, and importance of process monitoring for monitoring whether or not the pattern is formed as designed is more and more increased. For example, measurement and inspection of a circuit pattern and the like on a wafer are performed at completion of each manufacturing process in order to detect abnormality and failures (defects) in the semiconductor manufacturing process early or in advance.

At time of the above-mentioned measurement or inspection, in a measurement and inspection device such as an electron microscope device (SEM) using a method of a scanning electron beam, an electron beam (electron ray) is irradiated onto an object wafer (sample) while being scanned, and energy such as secondary electrons thus generated are detected. Then an image (a measurement image or an inspection image) is generated by signal processing or image processing or the like based on the detection. Then measurement and inspection are performed based on the image.

For example, if the device is a device which performs inspection of defects in a circuit pattern (an inspection device), images of the same circuit pattern are compared with each other using inspection images, and a part where a difference between the images is large is determined or detected as having defects. Moreover, if the device is a device which performs measurement in a circuit pattern (a measurement device), since a generation amount of secondary electrons or the like changes depending on unevenness (surface shape) of the sample, changes or the like of the surface shape of the sample can be perceived through an evaluation process of a signal of the secondary electrons. In particular, by utilizing the fact that the signal of secondary electrons abruptly rises or falls at edge portions of the circuit pattern, edge positions within the image of the circuit pattern are estimated so that a dimension value or the like of the circuit pattern can be measured. Then, based on the measurement result, quality of the processing of the circuit pattern can be evaluated.

When performing blanking of an electron beam B while shooting the electron beam B towards a sample in an electron beam drawing device, distribution of an energy amount inclines in a blanking movement direction within one shot, thus a desired shot shape is not maintained, and CD accuracy and positional accuracy aggravates. A method for solving such a problem is disclosed in Patent Literature 1. In Patent Literature 1, in order to solve the problem, voltages of opposite polarities are applied to two blanking deflectors. Blanking by a first blanking deflector and blanking by a second blanking deflector are repeatedly performed in one shot of the electron beam B towards the sample, so that bias of distribution of the energy amount is canceled out, and an electron beam B shot having a flat energy amount distribution without inclination is realized. The CD accuracy and the positional accuracy of electron beam drawing are thus improved.

PRIOR ART LITERATURE

Patent Literature

PTL 1: JP-A-2014-138050

SUMMARY OF INVENTION

Technical Problem

In order to improve the measurement accuracy on deep grooves and deep holes in the surface of a sample, in measurement and inspection devices of successive generations, it is necessary to increase an acceleration voltage of an electron beam to several times higher than an acceleration voltage of a related electron beam. At the same time, in order to maintain matching with a related device, the increased acceleration voltage is also required to correspond with the region of the acceleration voltage of the electron beam performed in the related measurement and inspection device.

An object of the invention is to provide a blanking (BLK) function of a measurement and inspection device, which corresponds to an acceleration voltage of a wide range of electron beams.

Solution to Problem

As a preferred example of the measurement and inspection device of the invention, the measurement and inspection device performs at least one of measurement and inspection of a sample by way of a scanning electron beam. The measurement and inspection device includes: a first blanking electrode, which includes two electrodes that sandwich an irradiation position on a plane perpendicular to an irradiation direction of an electron beam in a center and that face each other in a direction perpendicular to the plane; a second blanking electrode in proximity to the first blanking electrode in the irradiation direction of the electron beam, which includes two electrodes that sandwiches the irradiation position on the plane perpendicular to the irradiation direction of the electron beam in the center and that face each other in a direction perpendicular to the plane and that are parallel to the first blanking electrode; and a blanking control circuit, in which (i) an electrode (an electrode on a first side) of the first blanking electrode and an electrode (an electrode on a second side) of the second blanking electrode on a side opposite to the electrode on the first side of the first blanking electrode are connected with ground, (ii) a variable positive voltage and a variable negative voltage are generated according to an acceleration voltage of the electron beam, (iii) when blanking is turned to an ON state, output of the positive voltage is connected to an electrode on a second side of the first blanking electrode, and output of the negative voltage is connected to an electrode on a first side of the second blanking electrode, and (iv) when the blanking is turned to an OFF state, a ground reference signal is output to the electrode on the second side of the first blanking electrode and to the electrode on the first side of the second blanking electrode.

As another feature of the invention, in the measurement and inspection device, the blanking control circuit generates a variable positive voltage according to the acceleration voltage of the electron beam, when the blanking is turned to the ON state, output of the positive voltage is connected to the electrode on the second side of the first blanking electrode, and when the blanking is turned to the OFF state, a ground reference signal is output to the electrode on the second side of the first blanking electrode, and the ground reference signal is constantly output to the electrode on the first side of the second blanking electrode.

As another feature of the invention, in the measurement and inspection device, the blanking control circuit generates a variable negative voltage according to the acceleration voltage of the electron beam, when the blanking is turned to the ON state, output of the negative voltage is connected to the electrode on the first side of the second blanking electrode, and when the blanking is turned to the OFF state, a ground reference signal is output to the electrode on the first side of the second blanking electrode, and the ground reference signal is constantly output to the electrode on the second side of the first blanking electrode.

Advantageous Effect

According to the invention, a measurement and inspection device which includes a blanking (BLK) unit is realized. The blanking unit is capable of corresponding to a wide range of acceleration voltages (from several times higher than related acceleration voltages to low acceleration voltages) of an electron beam, and is capable of reducing the influence on swinging of the electron beam caused by circuit noise and disturbance noise.

BRIEF DESCRIPTION OF DRAWINGS

FIG. 7A is a diagram illustrating a problem in a configuration of a related blanking control electrode, FIG. 7B is a diagram illustrating a problem in a configuration in which two related blanking control electrodes are deflected in the same direction, and FIG. 7C is a diagram illustrating a problem in a configuration in which two related blanking control electrodes are deflected in a reverse direction.

FIGS. 8A and 8B are conceptual diagrams of a blanking (BLK) unit proposed in the present embodiment, in which FIG. 8A shows an ON state of a BLK control signal, and FIG. 8B shows an OFF state of the BLK control signal.

DESCRIPTION OF EMBODIMENTS

Figure 1:
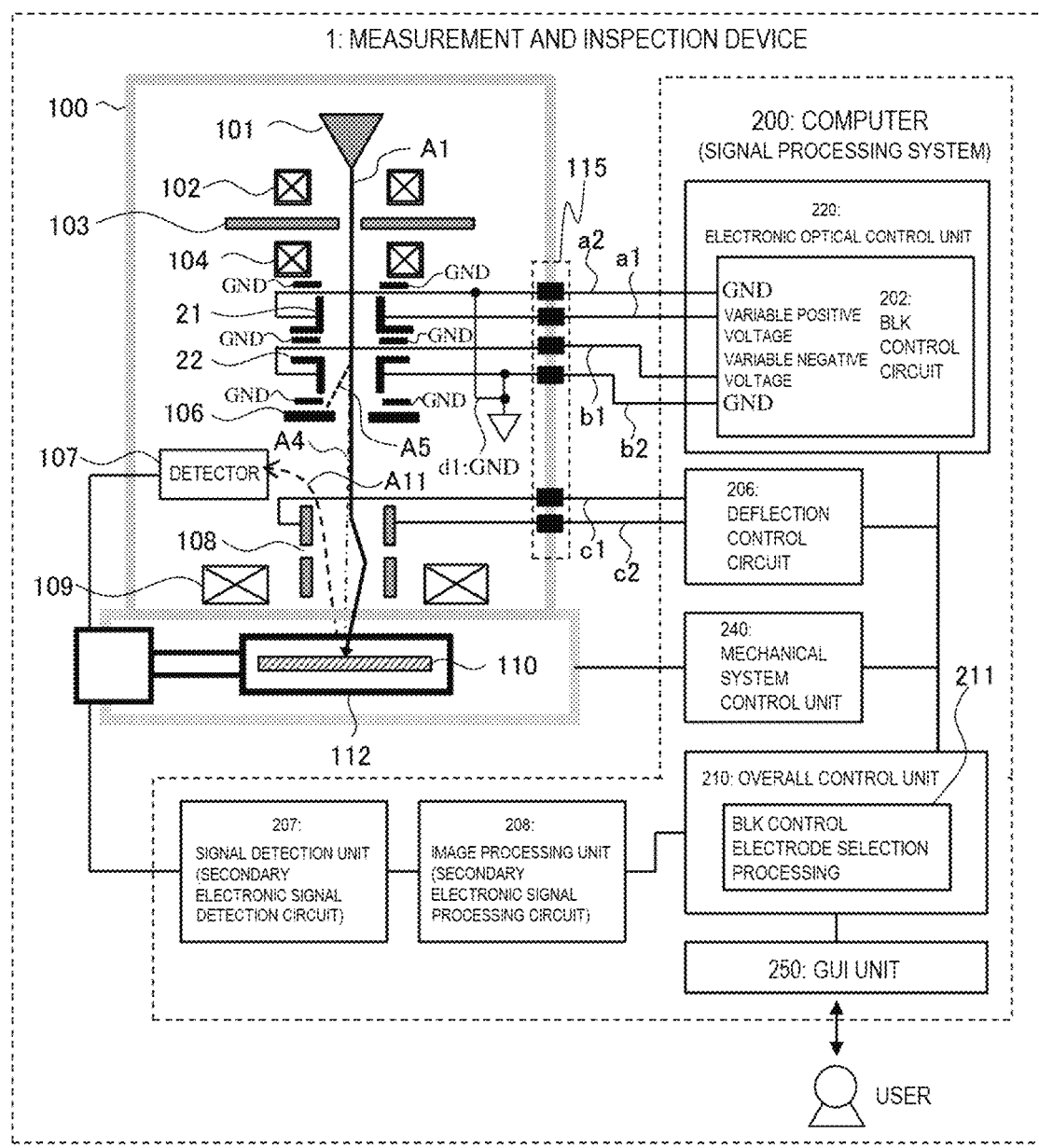
FIG. 1 is a schematic configuration diagram of a measurement and inspection device which includes a blanking unit according to Embodiment 1.

Hereinafter, embodiments of the invention will be described in detail with reference to the drawings. In all the drawings for explaining the embodiments, in principle, the same members are denoted by the same reference numerals, and repetitive descriptions thereof will be omitted. Hereinafter, cases where only measurement is performed, cases where only inspection is performed, and cases where both measurement and inspection are possibly performed by a measurement and inspection device are included. Blanking is abbreviated as BLK as appropriate.

<Preconditions>

Before describing the present embodiment in detail, technical parts (a BLK control unit in a related SEM measurement and inspection device) and details of problems and the like, which are backgrounds or preconditions of the present embodiment, will be briefly described below with reference to FIGS. 2 to 7.

Figure 2:
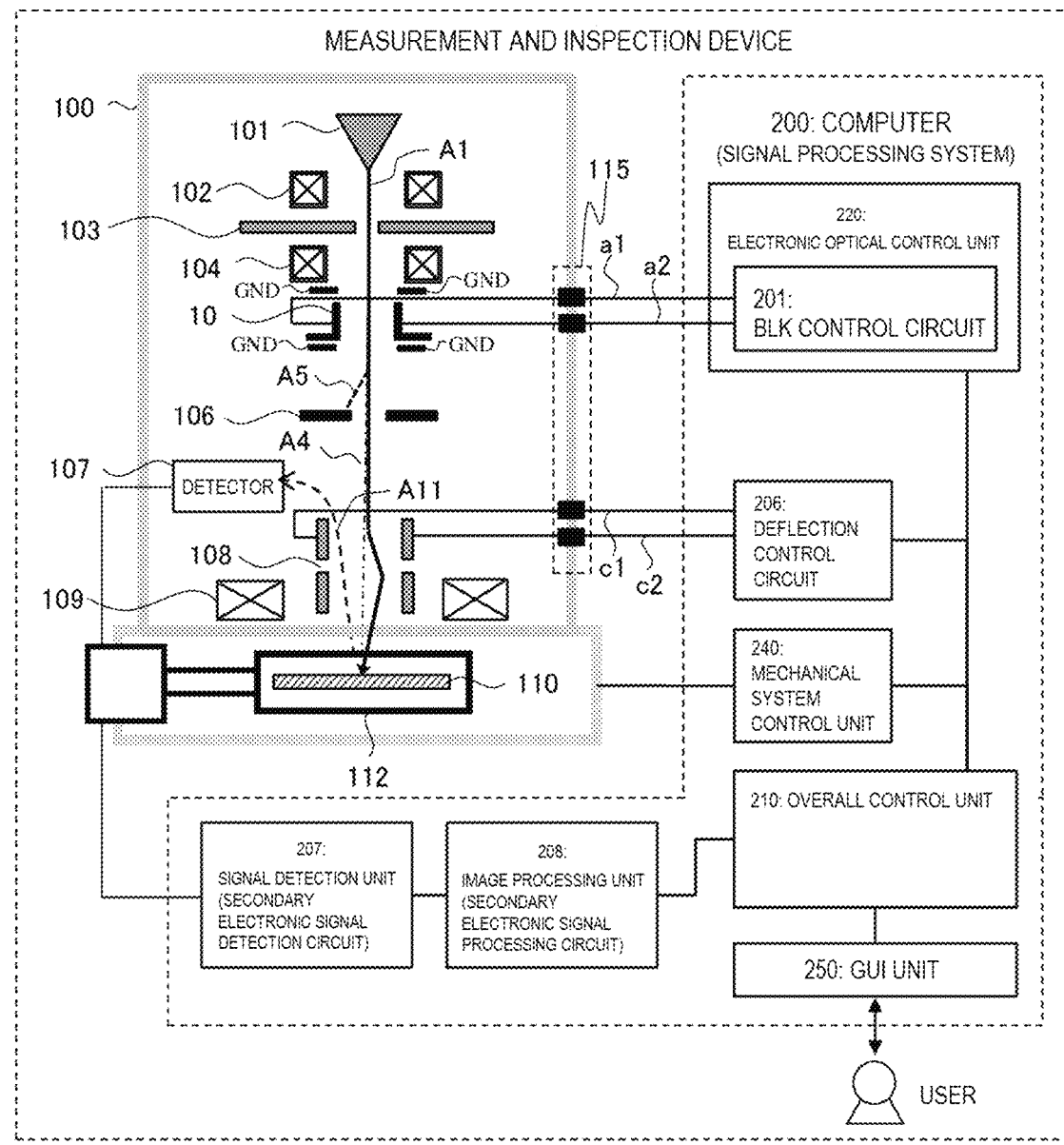
FIG. 2 is a schematic configuration diagram of a related SEM measurement and inspection device.

A configuration of a related SEM measurement and inspection device is shown in FIG. 2. The measurement and inspection device includes: a column (an electronic optical column) 100, a sample stage 112 (stage) on which a sample 110 is placed as an object of measurement or inspection, a computer 200 (or a signal processing system), and the like. The computer 200 is stored in, for example, a control rack in the form of a PC, a control board, or the like. Each unit of the computer 200 is implemented by, for example, software program processing using a processor, a memory, or the like, or processing of a dedicated circuit.

The computer 200 includes: an overall control unit 210, an electronic optical control unit 220 (BLK control circuit 201), a deflection control circuit 206, a mechanical system control unit 240, a signal detection unit (secondary electronic signal detection circuit) 207, an image processing unit (secondary electronic signal processing circuit) 208, a GUI unit (user interface unit) 250, and the like.

The column 100 (vacuum) includes, as an irradiation system (electronic optical system), an electron gun 101 which emits an electron beam A1, a focusing lens (first condenser lens) 102 through which the emitted electron beam A1 passes, a diaphragm 103, a focusing lens (second condenser lens) 104, a blanking control electrode 10 (BLK electrode), an aperture 106, a deflector 108, an objective lens 109 and the like. The column 100 includes, as a detection system, a detector 107 which detects a secondary electron A11 generated from the sample 110 by the irradiated electron beam A1 (A4).

In the column 100 (vacuum), the electron beam A1 generated or emitted from the electron gun 101 passes through the first condenser lens (focusing lens) 102, the diaphragm 103, and the second condenser lens (focusing lens) 104, and is focused. Then the electron beam A1 is subjected to deflection control via the deflector 108, and is irradiated while scanning over the sample 110 via the objective lens 109 and the like. When the beam A1 (A4) is irradiated, the secondary electron A11 is generated from the sample 110 and is detected by the detector 107. The signal (analog signal) detected by the detector 107 is converted into a digital signal by the signal detection unit 207 (secondary electronic signal detection circuit). Based on the digital signal, a two-dimensional image is generated by the image processing unit 208 (secondary electronic signal processing circuit) and is displayed on a GUI screen. A circuit pattern is measured based on the image (in a case of the measurement function).

The GUI unit 250 performs processing to provide an interface (GUI screen or the like) to a user (measurer or inspector). The GUI unit 250 provides a GUI screen for inputting (setting) inspection conditions or the like, and a GUI screen for displaying inspection results (two-dimensional images or the like). The GUI unit 250 includes input and output devices such as a keyboard and a display, a communication interface unit, and the like. The user can select and execute the measurement function or the inspection function on the GUI screen.

The overall control unit 210 controls the entire device (220, 240, 207, 208, 206, and the like) in accordance with an instruction from the GUI unit 250. For example, the overall control unit 210 performs measurement and inspection processing by controlling the electronic optical control unit 220, the deflection control unit 206, the mechanical system control unit 240 and the like according to measurement or inspection conditions and instructions input by the user on the screen of the GUI unit 250. For example, when the measurement or inspection is performed, the overall control unit 210 receives data information such as a two-dimensional image generated through the signal detection unit 207 and the image processing unit 208, and displays the data information on the screen of the GUI unit 250.

The electronic optical control unit 220 controls an electronic optical system (irradiation system) in the column 100 according to the control of the overall control unit 210. In particular, high-speed BLK control is performed by applying a control signal (BLK control signal) to the BLK control electrode 10 from the BLK control circuit 201 through signal lines (a1 and a2) and the like. Reference numeral 115 denotes a drive circuit or a terminal which connects the lines.

The deflection control circuit 206 applies a deflection control signal to the deflector 108 through signal lines (c1 and c2) in order to control the scanning by deflecting the electron beam according to the control of the overall control unit 210.

The mechanical system control unit 240 controls a mechanical system which includes the sample stage 112 and the like. For example, the sample stage 112 can be moved in a Y direction in accordance with the scanning control of the electron beam (see FIG. 3).

[Precondition (1)]

Figure 4:
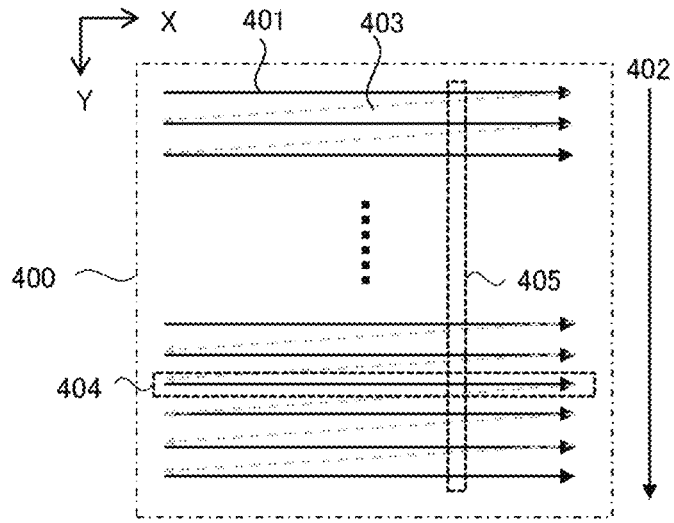
FIG. 4 is a diagram showing a raster scanning method in the related device (and in the present embodiment).

An electron beam scanning method in an SEM measurement and inspection device will be described below. For example, a normal scanning using a CD-SEM (length measuring SEM) is called a TV scanning or a raster scanning, and scanning time for a single screen is substantially 26 μs. A scanning at an n-time speed with respect to the TV scanning is called an n-time speed scanning, for example, in the case of a four-time speed scanning, the scanning time for a single screen is substantially 26/4=6 μs. A raster scanning method is illustrated in FIG. 4.

In the above method, secondary electrons are emitted from a sample because of an interaction between the sample and a beam (primary electron beam) incident on the sample. The number of emitted electrons per incident electron is called a secondary electron emission rate ($\eta$). $\eta$ depends on irradiation energy of the beam, a material and a shape of the sample, and the like. When $\eta<1$, since negative charges are accumulated on the sample by beam irradiation, the sample is negatively charged. Meanwhile, when $\eta>1$, the sample is positively charged since positive charges are accumulated on the sample.

For example, even if the primary electron beam is scanned on the negatively charged sample to detect secondary electrons from the sample so as to obtain an image of the secondary electrons (secondary electron image), a (negatively) charged portion of the sample is brightly shined, which causes a problem that observation (measurement or inspection) of the state of the surface of the sample becomes impossible or less accurate. Inversely, even if a secondary electron image is obtained by scanning a beam on a positively charged sample, the (positively) charged portion of the sample is darkened, which also causes the problem that the observation is impossible or less accurate. In particular, when the sample is an insulating material, the above phenomenon becomes significant.

The charge amount also depends on the shape of the pattern of the sample (and the scanning method therefor) and the like. For example, when a horizontal line of the pattern is scanned (when a line in an X direction is scanned by the raster scanning method) (see 404 in FIG. 4), since the beam is continuously irradiated on the horizontal line, the accumulated charge amount increases. Therefore, potential rise caused by charging is large, the number of secondary electrons drawn back to the sample increases, and the image contrast is lowered. Meanwhile, when a vertical line (having the same length or area as the horizontal line) of the same pattern is scanned (by the same raster scanning method) (see 405 in FIG. 4), since the scanning is divided into a plurality of discontinuous parts in the horizontal direction (the X direction), continuous irradiation time on the vertical line is shortened. Therefore, the potential rise caused by charging is small, the number of secondary electrons that can be detected is larger on the vertical line, and an image with good contrast is obtained.

When the vertical or horizontal line of the pattern is observed by the raster scanning as described above, contrast of the horizontal line is lower than contrast of the vertical line, which causes, for example, a problem that edges of the line disappear. That is, due to the influence of the charging of the sample caused by beam scanning, there may be problems in accuracy of measurement or inspection.

In order to solve or alleviate the problems, it is necessary to suppress the undesired charging as described above. In other words, it is necessary to reduce the number of secondary electrons returned to the sample (reduce the charge amount) by suppressing the potential rise on the surface of the sample caused by the beam irradiation (continuous irradiation). Therefore, it is effective to shorten unnecessary irradiation time of the beam on the sample.

High-speed blanking control is used as a method for shortening the irradiation time. In the blanking control of a related SEM (see FIG. 2), irradiation or blocking of the beam towards the sample is switched and controlled using the BLK electrode 10, the deflector 108, and the aperture 106. For example, normally the beam is switched to an irradiation (blocking OFF) state and is temporarily or partially switched to a non-irradiation (blocking ON) state. In particular, if high-speed or detailed switching control is possible, unnecessary irradiation time can be reduced accordingly.

[Precondition (2)]

The blanking control unit of the related SEM measurement and inspection device shown in FIG. 2 includes a BLK control circuit 201, a BLK control electrode 10 and the like. Normally, at time of irradiation when blanking (blocking) is OFF, the beam is irradiated to the sample 110 through flows A1 and A4, and the secondary electron A11 is detected by the detector 107. At time of non-irradiation when the blanking is ON, the beam is blocked by the aperture 106 in flows A1 and A5.

[Precondition (3)]

Figure 3:
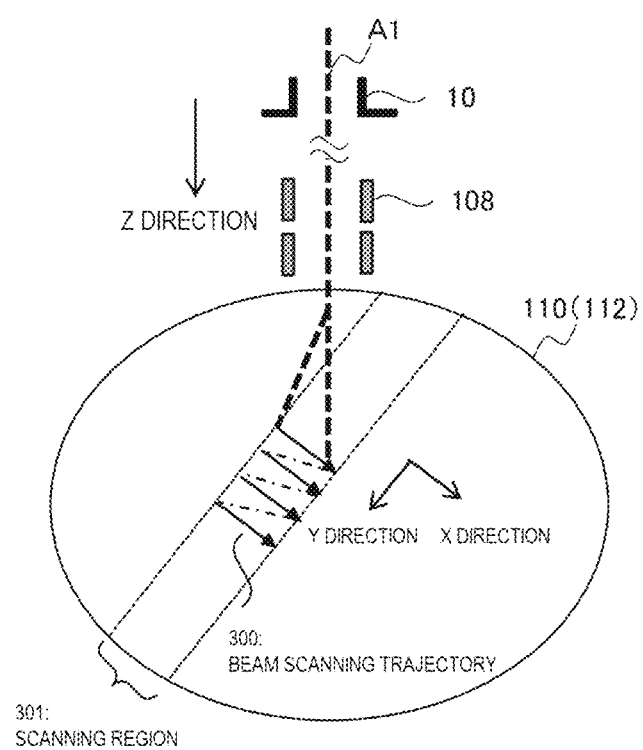
FIG. 3 is a perspective view schematically showing a scanning method of an electron beam in a related device (and in the present embodiment).

Hereinafter, a case of a raster scanning method in a related scanning electron beam method is shown in FIGS. 3, 4 and the like.

The raster scanning method is illustrated in FIG. 4. A rectangular region 400 in FIG. 4 shows a region corresponding to a scanning region 301 (beam scanning trajectory 300) on a sample 110 of FIG. 3 (a wafer placed on a sample stage 112 as an example). 401 shows continuous scanning (irradiation) of beams for each line in an X direction (corresponding to the X direction in FIG. 3). 402 shows continuous movement (feeding) of line sequential beams in a Y direction (corresponding to the Y direction in FIG. 3). 403 shows a returning trajectory (in a non-irradiation or blocking state) of the beams between the lines in the X direction. 404 is an example (which becomes a continuous irradiation area) of a line in the X direction (horizontal line) in a pattern (irradiation target area), and 405 is an example (which becomes a non-continuous irradiation area) of a line in the Y direction (vertical line).

At the time of measurement or inspection, a beam is scanned (irradiated) for each line (401) in the X direction. When an end point of a line is reached, scanning of the line is completed. Along with movement in the Y direction (402), the beam is swung back to a left start point (the head of a next line) in the X direction (403), and scanning of the next line is started. Similar operation is repeated to perform the scanning.

[Precondition (4)]

FIG. 3 shows a scanning direction of an electron beam and the like in the SEM measurement and inspection device (see FIG. 2) and in the raster scanning method (see FIG. 4). The illustrated Z direction is an irradiation direction of the beam A1 which is perpendicular to the plane of a sample 110 (or a sample stage 112). In X and Y directions (coordinate), as an example, the scanning direction of the beam A1 for each line in the raster scanning method is defined as the X direction, and the moving direction (feeding direction) of the beam A1 (or the sample stage 112), which is orthogonal to the X direction, is defined as the Y direction. Regions in the X direction become continuous scanning (irradiation) regions, and regions in the Y direction become discontinuous scanning (irradiation) regions.

For example, the beam (or the sample stage 112 on which the sample 110 is placed) continuously moves in the Y direction to repeat the scanning for each line in the X direction. Deflection control signals (c1 and c2) from a deflection control circuit 206 controls deflection performed by a deflector 108, so as to repeat the scanning. The secondary electron A11 generated from the sample 110 is detected by the detector 107 in synchronization with the scanning for each line in the X direction. Thus a two-dimensional image (measurement image or inspection image) is obtained through the signal detection unit 207 and the image processing unit 208.

[Precondition (5)]

Figure 5:
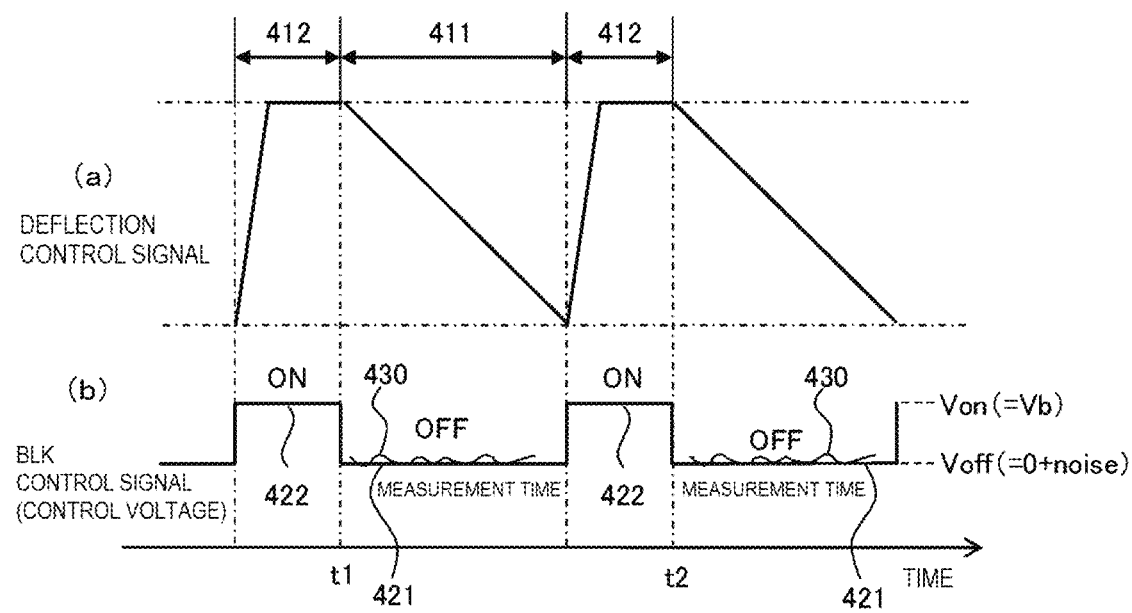
FIG. 5 is a diagram showing waveform examples of a beam deflection control signal and a blanking control signal in the case of the raster scanning method in the related device (and in the present embodiment).
Figure 6A:
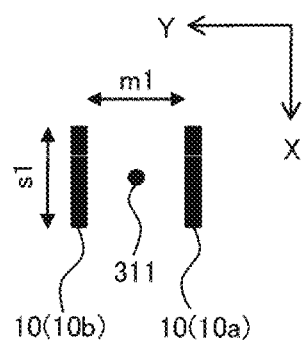
FIG. 6A is a top view showing a configuration of a blanking electrode in the related device (and in the present embodiment)

FIG. 6A corresponds to FIG. 3, and shows a top view of a configuration example of the BLK control electrode 10, which is an element for controlling the blocking of an electron beam (A1) in the plane of the X and Y directions in FIG. 3. Typically, the BLK control electrode 10 has a set of two metal plates (10a and 10b) arranged in parallel or facing to each other. BLK control signals (waveform of ON or OFF) from the BLK control circuit 201 (FIG. 5) causes a voltage difference to be applied to BLK electrodes 10 (10a and 10b), so as to generate an electric field between the electrodes. Accordingly, the beam (A1) is deflected at a position passing between the electrodes (311) by the generation of a Coulomb force. Sensitivity of the BLK electrode (deflection distance per unit voltage applied) becomes lower as an inter-electrode distance (m1) becomes longer, and the sensitivity becomes lower as the size of the electrode becomes smaller (s1: length, area, and the like).

Normally, when the BLK control signal (FIG. 5(b)) is OFF (421), no electric field (deflection electric field) is generated between the BLK control electrodes 10. The beam (A4) passes through a hole in the aperture 106 under the BLK control electrodes 10 and is irradiated on the sample 110. When the same BLK control signal is ON (422), an electric field (deflection electric field) is generated between the BLK control electrodes 10. The beam (A5) is deflected and is blocked by the aperture 106 from outside the hole of the aperture 106, thus the beam is not irradiated on the sample 110.

The voltage of the BLK control signal applied to the BLK control electrodes 10 ranges from about several tens to 100 V. Although in the shown case a predetermined voltage is applied to one (the signal line a1 of the BLK control signal) of the two metal plates (10a and 10b) of the BLK control electrodes 10 while the other one (the ground line a2 of the BLK control signal) is grounded, in some cases positive and negative (±) voltages are applied to the two plates.

[Precondition (6)]

FIG. 5 shows voltage waveforms of (a) a deflection control signal and (b) a BLK control signal corresponding to the scanning in FIG. 4. (a) shows a waveform of a deflection control signal for controlling the deflection of a beam so as to make the trajectory (region) 400 in FIG. 4, which corresponds to deflection control signals (c1 and c2) applied from a deflection control circuit 206 to a deflector 108. (b) shows a waveform of a BLK control signal for controlling the ON or OFF of blocking of a beam by BLK control, which corresponds to BLK control signals (a1 and a2) applied from a BLK control circuit 201 to a BLK control electrode 10. In the waveform (a), 411 is a portion of the beam deflection control during scanning (irradiation) for each line (401) in the X direction when a measurement image (data) is acquired. 412 is a portion of the beam deflection control (during a swing back period) when scanning is completed at an end point of a line (401) in the X direction and returns to the start point (403). In the waveform (b), 421 shows the waveform when the BLK control signal is OFF (blanking OFF state) in synchronization with 411 of (a), and 422 shows the waveform when the BLK control signal is ON (blanking ON state) in synchronization with 412 of (a).

In order to prevent the beam from being unnecessarily irradiated on the sample 110 at time of the beam swing-back (403) after completing the scanning for one line in the X direction in FIG. 4, the beam is deflected by switching the BLK control signal to ON and is blocked by the aperture 106 as in 412 and 422.

Further, if the BLK control signal is switched to ON appropriately only on one line (401), the irradiation of the beam is blocked at that portion. If the switching of ON or OFF can be realized in high speed or in detail, unnecessary irradiation time can be eliminated as much as possible and accuracy can be improved.

However, in the high-speed blanking described above, t1 and t2 shown in FIG. 5 represent time points at which the BLK control signal is switched from ON to OFF, and a voltage $V_{off}$ is, for example, 0 [V] during measurement time 421 to obtain an ideal waveform of the control signal. But strictly speaking, in the actual waveform, delay in convergence occurs due to the high-speed switching from a high voltage $V_b$ at the time of ON (Von) to 0 V at the time of OFF ($V_{off}$), and noise 430 is generated due to elements of the BLK control circuit 201 and the like. The noise 430 in the measurement time 421 causes the beam (A4) which passes between the BLK control electrodes 10 and irradiates on the sample 110 to shake. As a result, in the detected measurement image, the shake appears as distortion or the like, that is, the problem of low accuracy is caused.

[Precondition (7)]

Figure 6B:
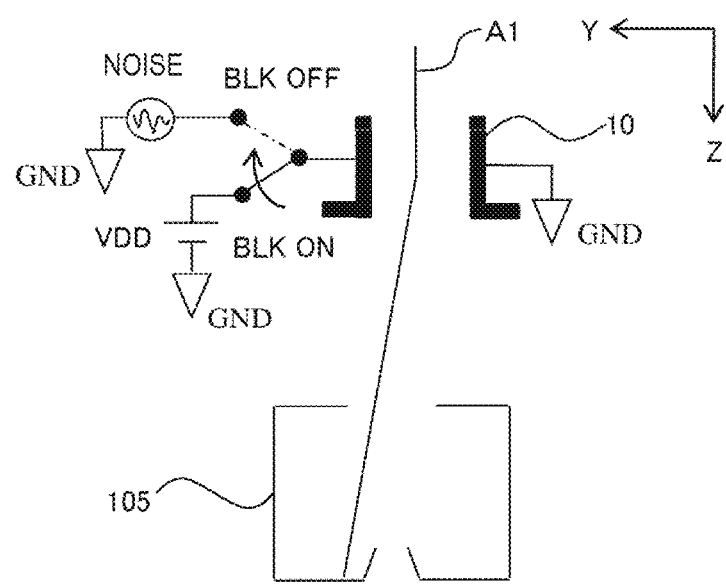
FIG. 6B is a diagram illustrating a configuration for measuring a current value (IP current value) of an electron beam using a Faraday cup.

As shown in a schematic cross section in FIG. 6B, a Faraday cup 105 is a device which captures charged particles carrying electric charges such as electrons in a vacuum in a metal (conductive) cup. Upon initially setting optical conditions and the like of a measurement and inspection device, the Faraday cup 105 is arranged below the blanking control electrodes 10 (BLK electrode) in the column 100. The electron beam A1 emitted from the electron gun 101 is deflected by the blanking control electrodes 10 and reaches the Faraday cup 105. A current value (IP current value) is measured by an ammeter connected to the Faraday cup 105 corresponding to the number of charged particles of the incident electron beam A1. The Faraday cup 105 corresponding to the acceleration voltage of the electron beam is a necessity in measurement and inspection devices of successive generations.

[Precondition (8)]

Problems of blanking (BLK) units in measurement and inspection devices of successive generations are described below in correspondence with increasing an acceleration voltage of an electron beam to several times higher than the acceleration voltage of a related electron beam.

As shown in FIG. 7A, a deflection force generated only by a configuration of one blanking control electrode adopted in the related measurement and inspection device (see FIG. 2) is insufficient for deflecting an electron beam with several times higher acceleration voltage toward inside of the Faraday cup or toward outside of the scanning field of view. Therefore, in order to obtain a sufficient deflection force, it is necessary to increase the control voltage VDD applied to the blanking control electrodes for several times. However, it is necessary to move a blanking (BLK) unit at a high speed, and it is difficult to move the blanking unit at a high speed when the control voltage is increased.

As shown in FIG. 7B, a configuration is considered to be used as a configuration for two blanking control electrodes, in which blanking control voltages of the same polarity are applied to electrodes on the same side of opposing BLK electrodes, while electrodes on opposite sides of the opposing BLK electrodes are connected to GND.

In the configuration of the two blanking control electrodes, an electric field is applied to each of the blanking control electrodes in the same direction, and a deflection force can be applied to the electron beam A1 in the same direction by the blanking control electrodes. Therefore, by adding the deflection force in the same direction provided by the upper and lower blanking control electrodes, it can be determined that it is possible to obtain a deflection force for deflecting an electron beam with several times higher acceleration voltage than a related electron beam toward the inside of the Faraday cup or toward the outside of the scanning field of view.

However, as described above, a noise electric field in the same direction is generated in the upper and lower blanking control electrodes due to the influence of the noise 430 generated during the measurement time 421 immediately after switching the BLK control signal from ON to OFF. Therefore, it is predicted that the influence of the noise 430 on swinging of the beam (A1) irradiated on the sample 110 through the BLK control electrodes 10 will increase.

FIG. 7C illustrates a case where two blanking control electrodes are formed and voltages having opposite polarities are applied, as disclosed in Patent Literature 1. In this configuration, the noise 430 generated during the measurement time 421 immediately after switching the BLK control signal from ON to OFF generates a noise electric field in the reverse direction in the upper and lower blanking control electrodes, and an effect of canceling out the influence of the noise 430 on the swinging of the beam (A1) irradiated on the sample 110 through the BLK control electrodes 10 is predicted.

However, when the BLK control signal is ON, blanking control voltages of opposite polarities are applied to the two blanking control electrodes, and a deflection force in the reverse direction is applied to the electron beam A1 from each of the blanking control electrodes. Therefore, it is determined that the deflection force is not sufficient for deflecting an electron beam with several times higher acceleration voltage than a related electron beam toward the inside of the Faraday cup or toward the outside of the scanning field of view.

Embodiment 1

Based on consideration of three blanking (BLK) units in FIG. 7, a conceptual diagram of a blanking (BLK) unit proposed in the present embodiment for measurement and inspection devices of successive generations is shown in FIG. 8.

The blanking (BLK) unit of the present embodiment includes upper and lower BLK electrode BLK electrodes 21 and 22, each configured by a first BLK electrode and a second BLK electrode, and a BLK control circuit 202 which generates two types of variable voltages including a variable positive voltage VDD (230) and a variable negative voltage VSS (231). The first BLK electrode and the second BLK electrode include two electrodes which sandwich an irradiation position on a plane perpendicular to an irradiation direction of an electron beam in the center and which face each other in a direction perpendicular to the plane, and the first BLK electrode and the second BLK electrode are positioned in proximity to each other in the irradiation direction of the electron beam with electrodes thereof arranged in parallel.

Output of the positive and negative BLK control voltages of the BLK control circuit 202 is connected to an electrode on the reverse side of the electrode pair of the upper and lower BLK electrodes 21 and 22, and remaining electrodes of the upper and lower BLK electrodes 21 and 22 are connected to GND.

Figure 8A:
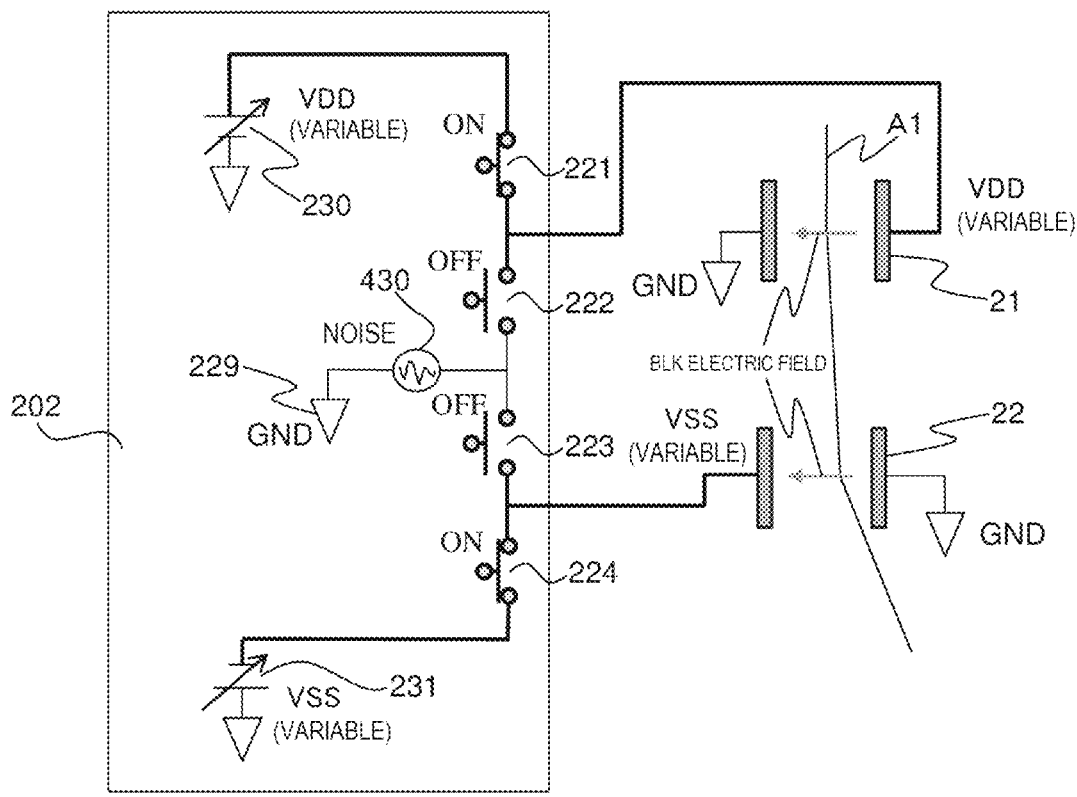

FIG. 8A shows an ON state of the BLK control signal. That is, at time of IP current measurement or when the beam is deflected outside the scanning field of view during measurement or inspection, the variable positive voltage VDD and the variable negative voltage VSS which are variable according to the acceleration voltage of the electron beam A1 are applied to the upper and lower BLK electrodes 21 and 22 in the reverse direction to generate a BLK electric field in the same direction while switch circuits 221 and 224 are ON and OFF. By adding up the BLK fields of the upper and lower BLK electrodes 21 and 22, a high electric field necessary for deflecting the electron beam A1 with the high acceleration voltage is obtained.

Figure 8B:
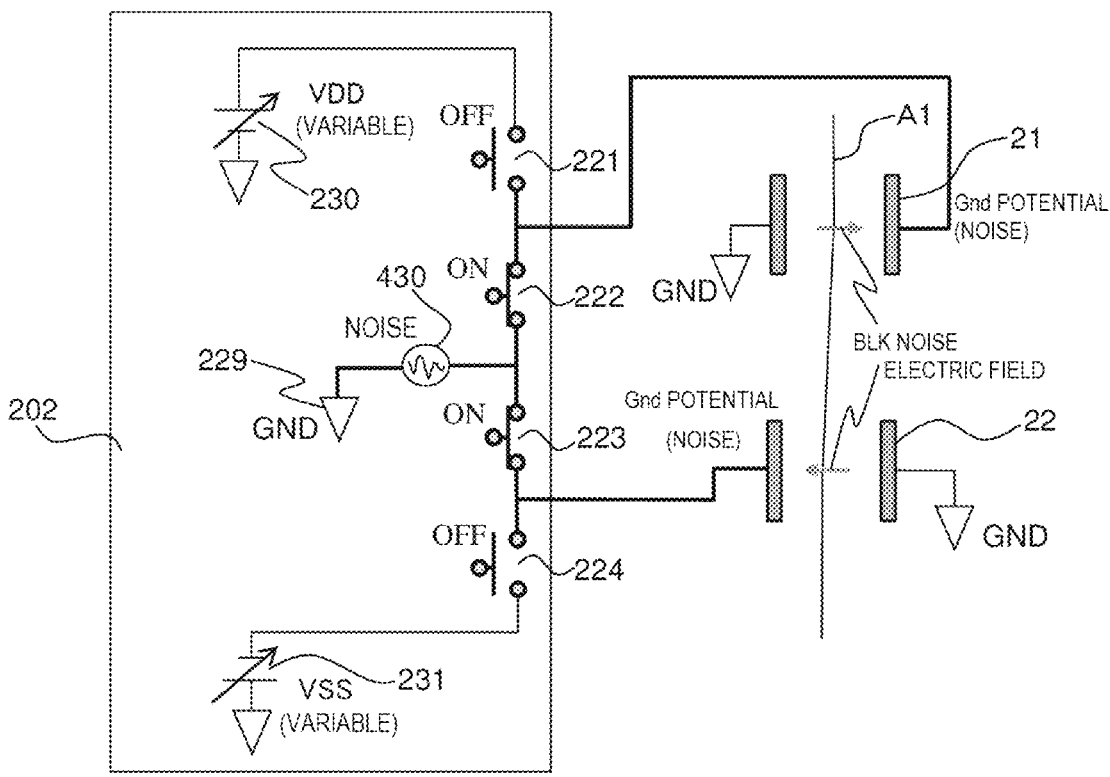

FIG. 8B shows an OFF state of the BLK control signal. That is, in a case where the electron beam A1 is irradiated onto the sample 110 during measurement or inspection, the switch circuits 221 and 224 are OFF, the switch circuits 222 and 223 are ON, and a common GND 229 of the BLK control circuit 202 is connected with electrodes on the reverse side of each electrode pair of the upper and lower BLK electrodes 21 and 22. Accordingly, when the BLK control signal is OFF, the noise 430 generated in the BLK control circuit 202 generates a BLK noise electric field in the reverse direction of the upper and lower BLK electrodes 21 and 22, so that the influence on the swinging of the electron beam A1 is canceled out. Therefore, noise reduction is realized.

FIG. 1 shows a measurement and inspection device (1) which includes the blanking (BLK) unit described above. The main difference between the measurement and inspection device (1) and the configuration of a related SEM measurement and inspection device shown in FIG. 2 is that: the BLK control circuit 202 is replaced by a BLK control circuit 201 of the electronic optical control unit 220; the blanking control electrodes 21 and 22 are replaced by a blanking control electrode 10 in the column 100 (vacuum); and a BLK control electrode selection processing 211 (which will be described below) is added to the overall control unit 210.

Further, the electron gun 101 which emits the electron beam A1 in the column 100 (vacuum) is replaced by an electron gun 101 whose acceleration voltage can be varied up to several times higher than the acceleration voltage of a related electron gun.

Figure 9:
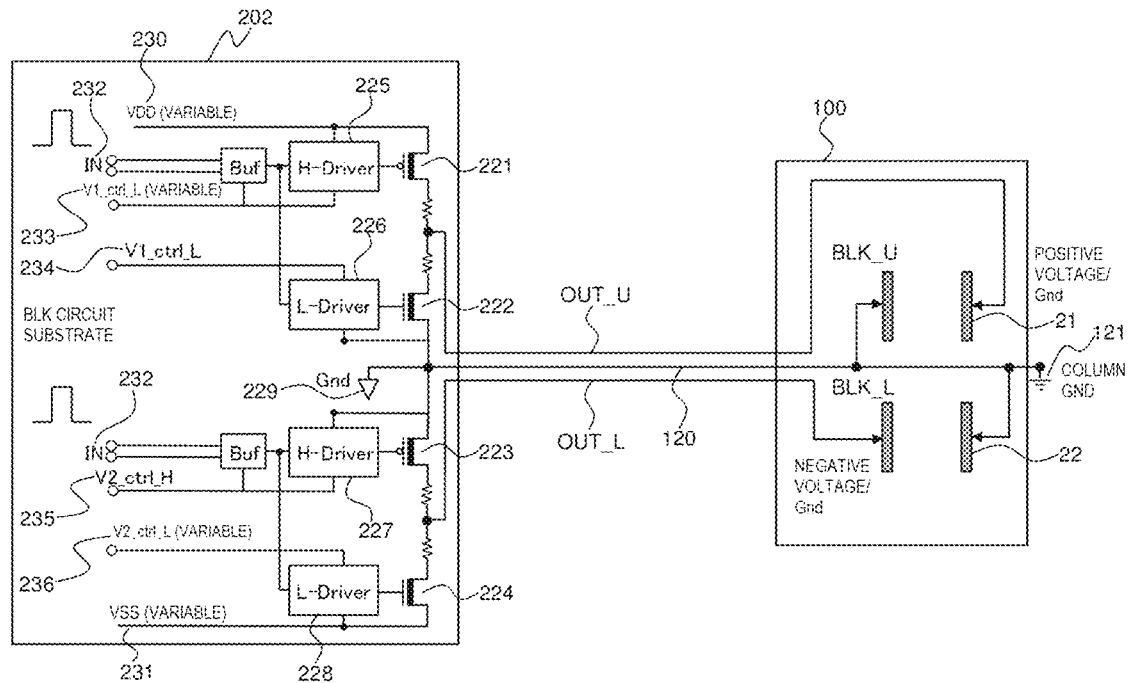
FIG. 9 is a diagram showing a configuration example of a BLK control circuit of the present embodiment.

A configuration example of the BLK control circuit 202 of the present embodiment is shown in FIG. 9.

Switch circuits 221 and 223 use pMOS transistors, and drive circuits H-drivers 225 and 227 for driving the pMOS transistors are used in combination. Further, switch circuits 222 and 224 use nMOS transistors, and drive circuits L-drivers 226 and 228 for driving the nMOS transistors are used in combination.

Control signals V1_ctrl_H 233 and V2_ctrl_H 235 for controlling drive voltages of the drive circuits H-Drivers 225 and 227, and control signals V1_ctrl_L 234 and V2_ctrl_L 236 for controlling driving voltages of the drive circuits L-drivers 226 and 228 are connected following switching between ON and OFF of the BLK control signal IN 232 and in accordance with selection of the BLK control electrode selection processing 211 (which will be described below).

The above-described switch circuits and drive circuits use general circuit configurations and are not specified in the present embodiment.

A common ground Gnd 229 of the BLK control circuit 202 and ground connection electrodes on the opposite sides of each of the upper and lower BLK electrodes 21 and 22 are connected by a ground line 120. A column GND 121 arranged on the side of a column (electronic optical column) 100 and the ground line 120 may or may not be connected with each other.

Figure 10:
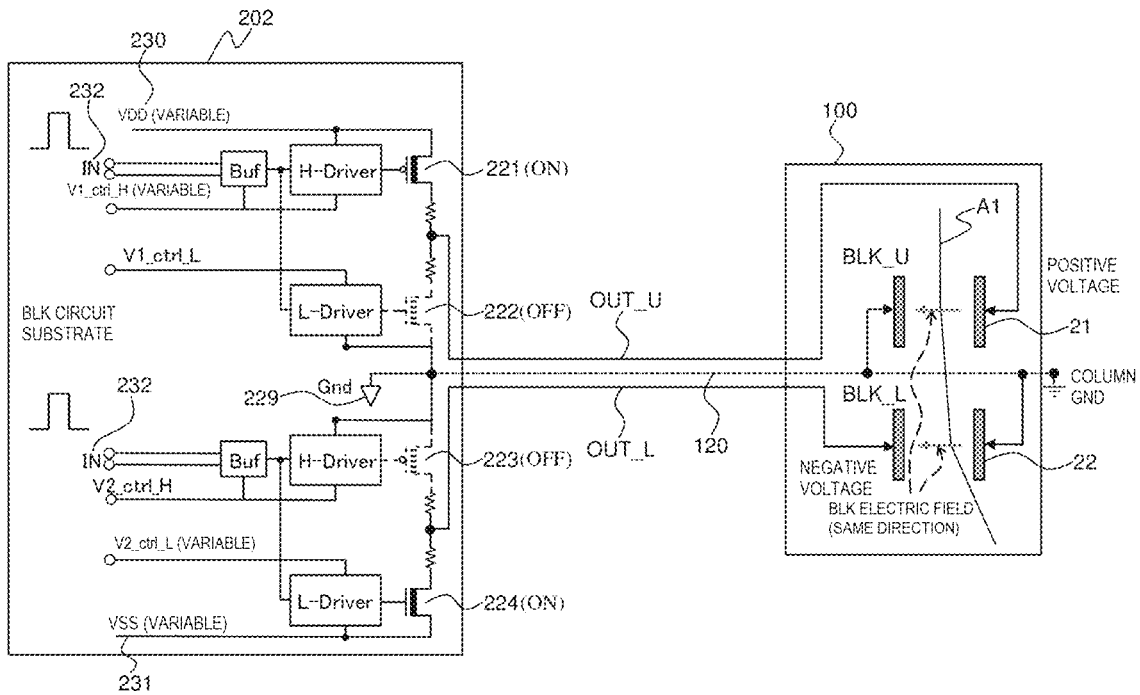
FIG. 10 is a diagram showing circuit operation of the BLK control circuit and electric fields of the two BLK electrodes when the BLK control signal is in the ON state.

FIG. 10 shows circuit operation of the BLK control circuit 202 when the BLK control signal is in the ON state, and an electric field of the two BLK electrodes 21 and 22. When the switch circuits 221 and 224 are ON and the switch circuits 222 and 223 are OFF, a positive voltage VDD is applied to one electrode of the upper BLK electrode (BLK_U) 21, and a negative voltage VSS is applied to an electrode on the side opposite to the upper BLK electrode of the lower BLK electrode (BLK_L) 22. As a result, a BLK electric field is generated in the two BLK electrodes 21 and 22 in the same direction. By adding up the BLK fields of the upper and lower BLK electrodes 21 and 22, a high electric field necessary for deflecting the electron beam A1 with the high acceleration voltage can be obtained.

Figure 11:
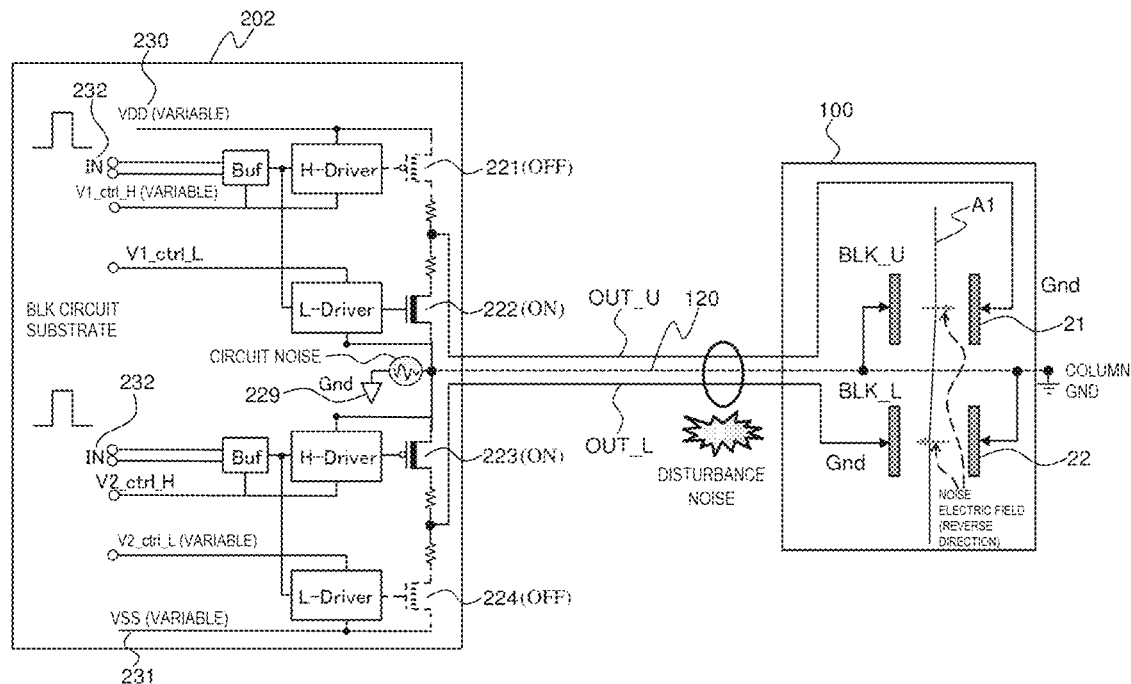
FIG. 11 is a diagram showing circuit operation of the BLK control circuit and electric fields of the two BLK electrodes when the BLK control signal is in the OFF state.

FIG. 11 shows circuit operation of the BLK control circuit 202 when the BLK control signal is in the OFF state, and an electric field of the two BLK electrodes 21 and 22. When the switch circuits 221 and 224 are OFF and the switch circuits 222 and 223 are ON, circuit noise generated in the BLK control circuit 202 and disturbance noise generated near the signal circuit are applied to one electrode of the upper BLK electrode (BLK_U) 21 and an electrode on the side opposite to the upper BLK electrode of the lower BLK electrode (BLK_L) 22. As a result, a noise electric field in the opposite direction is generated in the two BLK electrodes 21 and 22. Thus the influence on the swinging of the electron beam A1 is canceled out. Therefore, noise reduction can be realized.

Embodiment 2

Figure 12:
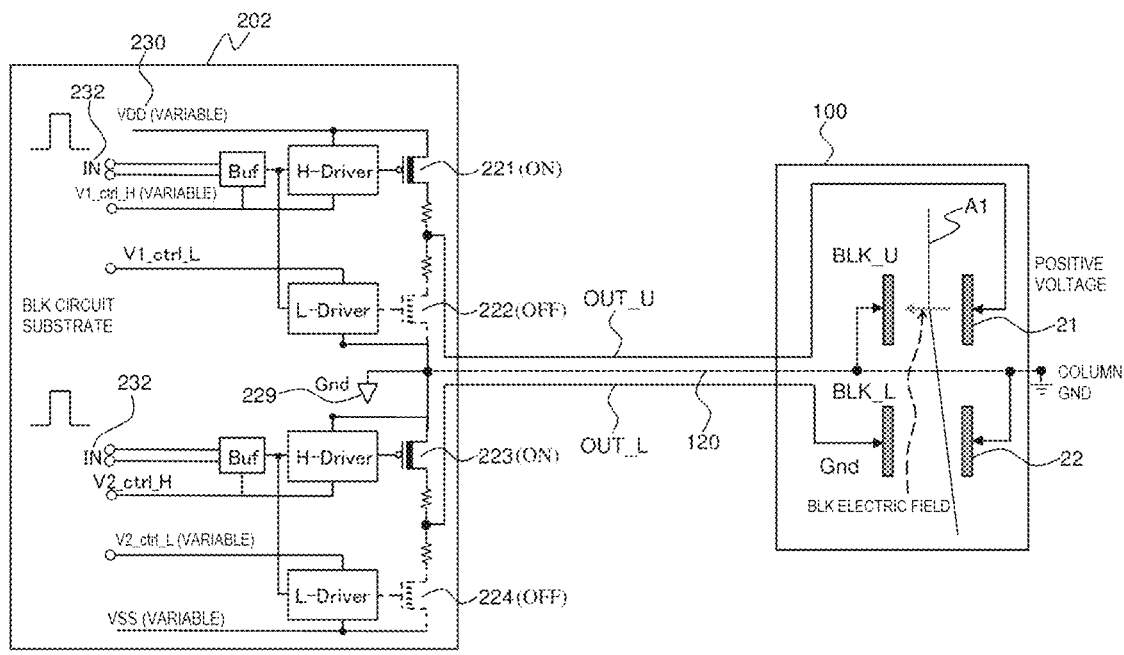
FIG. 12 is a diagram showing a case where only an upper BLK electrode (BLK_U) is used when the acceleration voltage of an electron beam is of low acceleration.

FIG. 12 shows a case where only the upper BLK electrode (BLK_U) 21 is used when a measurement and inspection device is used with a relatively low electron beam acceleration voltage as low as a related acceleration voltage.

Upon initial setting of the measurement and inspection device, it is selected by a user through a GUI unit 250 that only the upper BLK electrode (BLK_U) 21 is used, and the BLK control circuit 202 is set by the BLK control electrode selection processing 211.

FIG. 12 shows circuit operation of the BLK control circuit 202 when the BLK control signal is in the ON state, and an electric field of the upper BLK electrode 21. When the switch circuit 221 is ON and the switch circuit 222 is OFF, a positive voltage VDD is applied to one electrode of the upper BLK electrode (BLK_U) 21 to generate a BLK electric field.

Further, when the switch circuit 223 is always ON and the switch circuit 222 is always OFF, the ground Gnd is connected with the electrodes of the lower BLK electrode (BLK_L) 22.

In the BLK control circuit 202 of the above configuration, in a case where the BLK control signal is in the OFF state, when the switch circuit 221 is OFF and the switch circuit 222 is ON, circuit noise generated in the BLK control circuit 202 and disturbance noise generated near the signal circuit are applied to one electrode of the upper BLK electrode (BLK_U) 21 and an electrode on the side opposite to the upper BLK electrode of the lower BLK electrode (BLK_L) 22. As a result, a noise electric field in the opposite direction is generated in the two BLK electrodes 21 and 22. Thus the influence on the swinging of the electron beam A1 is canceled out. Therefore, noise reduction can be realized.

Figure 13:
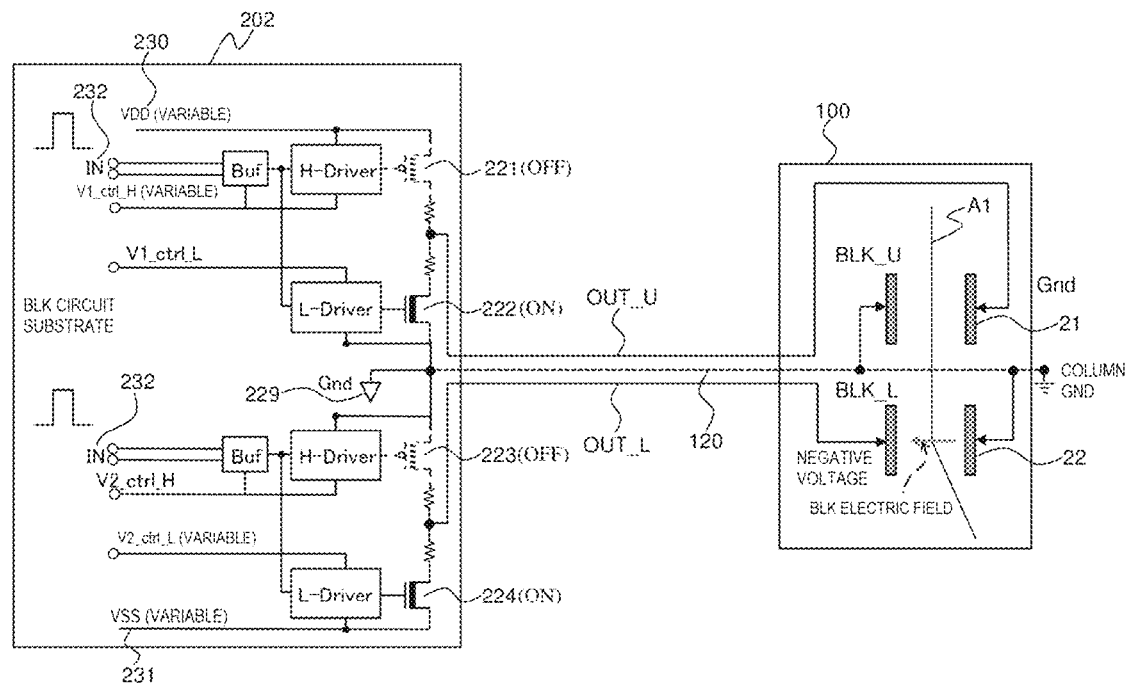
FIG. 13 is a diagram showing a case where only a lower BLK electrode (BLK_L) is used when the acceleration voltage of the electron beam is of low acceleration.

FIG. 13 shows a case where only the lower BLK electrode (BLK_L) 22 is used when the measurement and inspection device is used with a relatively low electron beam acceleration voltage as low as a related acceleration voltage.

Upon initial setting of the measurement and inspection device, it is selected by a user through a GUI unit 250 that only the lower BLK electrode (BLK_L) 22 is used, and the BLK control circuit 202 is set by the BLK control electrode selection processing 211.

FIG. 13 shows circuit operation of the BLK control circuit 202 when the BLK control signal is in the ON state, and an electric field of the lower BLK electrode 22. When the switch circuit 223 is OFF and the switch circuit 224 is ON, a negative voltage VSS is applied to one electrode of the lower BLK electrode (BLK_L) 22 to generate a BLK electric field.

Further, when the switch circuit 221 is always OFF and the switch circuit 222 is always ON, the ground Gnd is connected with the electrodes of the upper BLK electrode (BLK_U) 21.

In the BLK control circuit 202 of the above configuration, in a case where the BLK control signal is in the OFF state, when the switch circuit 223 is ON and the switch circuit 224 is OFF, circuit noise generated in the BLK control circuit 202 and disturbance noise generated near the signal circuit are applied to one electrode of the upper BLK electrode (BLK_U) 21 and an electrode on the side opposite to the upper BLK electrode of the lower BLK electrode (BLK_L) 22. As a result, a noise electric field in the opposite direction is generated in the two BLK electrodes 21 and 22. Thus the influence on the swinging of the electron beam A1 is canceled out. Therefore, noise reduction can be realized.

Embodiment 3

A configuration is considered in which a plurality of (3 or more) BLK electrodes having different or identical sensitivities and the like are arranged in the irradiation direction of an electron beam (Z direction) in the column 100. Of the BLK electrodes, two electrodes facing each other are arranged in parallel in the same direction, and two BLK electrodes are selected from among the plurality of (three or more) BLK electrodes in accordance with measurement or inspection conditions of the measurement and inspection device to realize two-stage BLK control.

Figure 14:
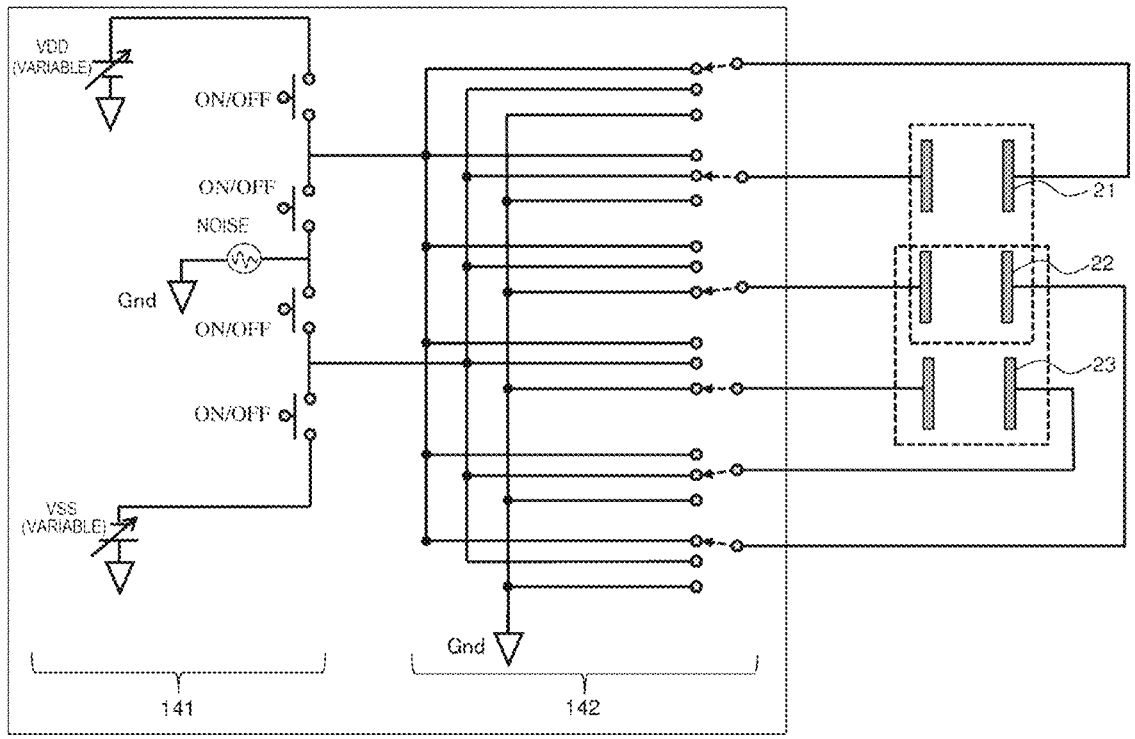
FIG. 14 is a conceptual diagram of a configuration in which any two BLK electrodes are selected from a plurality of (three or more) BLK electrodes to realize a two-stage BLK control.

FIG. 14 shows a conceptual diagram of a configuration of a blanking (BLK) unit of a measurement and inspection device which performs two-stage BLK control. The measurement and inspection device includes a plurality of BLK electrodes 21, 22 and 23, a BLK control circuit 141 having three types of outputs (positive voltage, negative voltage and ground Gnd potential) which can be variably controlled, and a connection unit 142 for switchably connecting two electrodes of the BLK electrodes to the three types of outputs of the BLK control circuit and the ground Gnd. According to optical conditions, two BLK electrodes are selected from the plurality of BLK electrodes and are used to perform the two-stage BLK control.

As described above, upon initial setting of the measurement and inspection device in Embodiments 1, 2 and 3, a user can designate a level of the acceleration voltage of the electron beam and select the BLK electrodes to be used through the GUI unit 250. Upon receiving selection of the user, a positive voltage VDD and a negative voltage VSS are calculated corresponding to the acceleration voltage of the electron beam, and control signals V1_ctrl_H, V1_ctrl_L, V2_ctrl_H and V2_ctrl_L for controlling the desired ON or OFF of each switch circuit of the BLK control circuit 202 are calculated, and the calculation results are output to the BLK control circuit 202 by the BLK control electrode selection processing 211 performed by the overall control unit 210 for setting.

REFERENCE SIGN LIST

1: measurement and inspection device
10: first BLK control electrode
21: upper BLK control electrode
22: lower BLK control electrode
100: column (electronic optical column)
101: electron gun
102: first condenser lens (focusing lens)
103: diaphragm
104: second condenser lens (focusing lens)
105: Faraday cup (FC)
106: aperture
107: secondary electron detector
108: deflector (DEF)
109: objective lens
110: sample (measurement sample)
112: sample stage (stage)
115: driver circuit or terminal
120: ground line
121: column GND
141: BLK control circuit
142: connection unit
200: computer
201: related BLK control circuit
202: BLK control circuit of the present embodiment
206: deflection control circuit
207: signal detection unit (secondary electronic signal detection circuit)
208: image processing unit (secondary electronic signal processing circuit)
210: overall control unit
211: BLK control electrode selection processing
220: electronic optical control unit
229: common ground Gnd of BLK control circuit
230: variable positive voltage VDD
231: variable negative voltage VSS
232: BLK control signal
240: mechanical system control unit
250: GUI unit
300: beam scanning trajectory
301: scanning region
400: beam trajectory and beam region
401: scanning direction of primary electron beam
402: moving direction of primary electron beam
403: beam returning trajectory during blocking (swing back)
404: horizontal line (continuous irradiation region)
405: vertical line (discontinuous irradiation region)
411: portion of beam deflection control during scanning for each line in X direction when acquiring measurement image
412: portion of beam deflection control when scanning is completed at end point of line in X direction and returns to start point
421: when BLK control signal is OFF (blanking OFF state) in synchronization with 411
422: when BLK control signal is ON (blanking ON state) in synchronization with 412
430: noise generated in BLK control circuit A1: beam (primary electron beam)
A4: beam trajectory during irradiation
A5: beam trajectory during blocking
A11: secondary electron
a1: upper BLK control signal (signal line)
a2: upper BLK control signal (GND line)
b1: lower BLK control signal (signal line)
b2: lower BLK control signal (GND line)
c1 and c2: deflection control signal
d1: column ground GND
m1: inter-electrode distance
S1: electrode size

The invention claimed is:

1. A measurement and inspection device which performs at least one of measurement and inspection of a sample by way of a scanning electron beam, the measurement and inspection device comprising:
   a first blanking electrode, which includes two electrodes that sandwich an irradiation position on a plane perpendicular to an irradiation direction of an electron beam in a center and that face each other in a direction perpendicular to the plane;
   a second blanking electrode in proximity to the first blanking electrode in the irradiation direction of the electron beam, which includes two electrodes that sandwiches the irradiation position on the plane perpendicular to the irradiation direction of the electron beam in the center and that face each other in a direction perpendicular to the plane and that are parallel to the first blanking electrode; and
   a blanking control circuit, in which (i) an electrode (an electrode on a first side) of the first blanking electrode and an electrode (an electrode on a second side) of the second blanking electrode on a side opposite to the electrode on the first side of the first blanking electrode are connected with ground, (ii) a variable positive voltage and a variable negative voltage are generated according to an acceleration voltage of the electron beam, (iii) when blanking is turned to an ON state, output of the positive voltage is connected to an electrode on a second side of the first blanking electrode, and output of the negative voltage is connected to an electrode on a first side of the second blanking electrode, and (iv) when the blanking is turned to an OFF state, a ground reference signal is output to the electrode on the second side of the first blanking electrode and to the electrode on the first side of the second blanking electrode.

2. The measurement and inspection device according to claim 1, wherein
   the blanking control circuit generates a variable positive voltage according to the acceleration voltage of the electron beam,
   when the blanking is turned to the ON state, output of the positive voltage is connected to the electrode on the second side of the first blanking electrode, and
   when the blanking is turned to the OFF state, a ground reference signal is output to the electrode on the second side of the first blanking electrode, and the ground reference signal is constantly output to the electrode on the first side of the second blanking electrode.

3. The measurement and inspection device according to claim 1, wherein
   the blanking control circuit generates a variable negative voltage according to the acceleration voltage of the electron beam,
   when the blanking is turned to the ON state, output of the negative voltage is connected to the electrode on the first side of the second blanking electrode, and
   when the blanking is turned to the OFF state, a ground reference signal is output to the electrode on the first side of the second blanking electrode, and the ground reference signal is constantly output to the electrode on the second side of the first blanking electrode.

4. The measurement and inspection device according to claim 1, wherein
   the electrode on the first side of the first blanking electrode and the electrode on the second side of the second blanking electrode are connected with the ground reference signal in the blanking control circuit, a column GND, or a ground line which is connected with the ground reference signal and the column GND.

5. The measurement and inspection device according to claim 1, further comprising:
   a third blanking electrode in proximity to the second blanking electrode in the irradiation direction of the electron beam, which includes two electrodes that sandwich the irradiation position on the plane perpendicular to the irradiation direction of the electron beam in the center and that face each other in a direction perpendicular to the plane and that are parallel to the second blanking electrode; and
   a connection unit, which switchably connect the ground Gnd and three kinds of output from the blanking control circuit such as output of the variable positive voltage and negative voltage and output of the ground reference signal with an i-th blanking electrode and a j-th blanking electrode selected by a user.

6. The measurement and inspection device according to claim 5, further comprising:
   fourth to n-th blanking electrodes in proximity to the third blanking electrode in the irradiation direction of the electron beam, each of which includes two electrodes that sandwich the irradiation position on the plane perpendicular to the irradiation direction of the electron beam in the center, and that face each other in a direction perpendicular to the plane and that are parallel to the third blanking electrode.

7. A scanning electron beam device comprising:
   an electron gun emitting an electron beam;
   first blanking electrodes, which includes a first ground-connected electrode which is connected to a column ground, and a first electrode;
   second blanking electrodes, which includes a second ground-connected electrode which is connected to the column ground, and a second electrode; and
   a blanking control circuit,
   wherein the first blanking electrodes and the second blanking electrodes are arranged at different places along with a pass of the electron beam,
   wherein with respect to the electron beam, the first ground-connected electrode and the second electrode are placed in a first side,
   wherein with respect to the electron beam, the first electrode and the second ground connected electrode are placed in a second side which is opposite to the first side,
   wherein while a blanking state is an OFF state, the blanking control circuit makes the first electrode and the second electrode connect a ground of the blanking control circuit, and wherein while the blanking state is an ON state, the blanking control circuit outputs a positive voltage to the first electrode and outputs a negative voltage to the second electrode.

8. The scanning electron beam device according to claim 7,
wherein a value of the positive voltage and a value of the negative voltage are calculated based on a voltage value of the electron beam.

9. The scanning electron beam device according to claim 7,
wherein a value of the positive voltage, a value of the negative voltage, and a voltage value of the electron beam are set based on a user designation.

10. The scanning electron beam device according to claim 9,
wherein the column ground and ground of the ground of the blanking control circuit are connected via a line.

11. The scanning electron beam device according to claim 7,
wherein while the blanking state is an another ON state, the blanking control circuit outputs an another positive voltage to the first electrode and outputs makes the second electrode connect the ground of the blanking control circuit, and
a voltage of the electron beam in the another ON state, is lower than a voltage of the electron beam in the ON state.

* * * * *